(12) United States Patent
Shibata

(10) Patent No.: US 7,345,368 B2
(45) Date of Patent: Mar. 18, 2008

(54) SEMICONDUCTOR DEVICE AND THE MANUFACTURING METHOD FOR THE SAME

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 424 days.

(21) Appl. No.: 11/004,291

(22) Filed: Dec. 3, 2004

(65) Prior Publication Data
US 2006/0273434 A1 Dec. 7, 2006

(30) Foreign Application Priority Data
Dec. 5, 2003 (JP) .......................... P.2003-406703
Jan. 27, 2004 (JP) .......................... P.2004-017752

(51) Int. Cl.
*H01L 23/48* (2006.01)
*H01L 23/52* (2006.01)
*H01L 29/40* (2006.01)

(52) U.S. Cl. ................. 257/773; 257/775; 257/776; 257/781; 257/782; 257/784; 257/792; 257/793; 257/626; 257/632; 257/688; 257/E27.01

(58) Field of Classification Search ........ 257/499–503, 257/780–795, 626, 668, 632–651, 671, 687, 257/688, 700–702, 709, 717, 752, 753, E23.006–E23.114; 438/124, 126, 622–641, 958, 967
See application file for complete search history.

(56) References Cited

U.S. PATENT DOCUMENTS

| | | | | |
|---|---|---|---|---|
| 5,229,646 A | * | 7/1993 | Tsumura | 257/782 |
| 5,898,223 A | * | 4/1999 | Frye et al. | 257/777 |
| 5,905,303 A | * | 5/1999 | Kata et al. | 257/701 |
| 6,350,664 B1 | * | 2/2002 | Haji et al. | 438/459 |
| 6,425,516 B1 | * | 7/2002 | Iwatsu et al. | 228/180.22 |
| 6,476,503 B1 | * | 11/2002 | Imamura et al. | 257/780 |
| 6,492,200 B1 | * | 12/2002 | Park et al. | 438/113 |
| 6,551,862 B2 | * | 4/2003 | Oota et al. | 438/118 |
| 2001/0033016 A1 | | 10/2001 | Sumikawa et al. | |
| 2002/0064935 A1 | * | 5/2002 | Honda | 438/622 |
| 2003/0116867 A1 | * | 6/2003 | Nakamura et al. | 257/784 |
| 2003/0183947 A1 | * | 10/2003 | Ohuchi | 257/778 |

FOREIGN PATENT DOCUMENTS

| | | |
|---|---|---|
| JP | 11-150090 | 6/1999 |
| JP | 2001-85453 | 3/2001 |

\* cited by examiner

*Primary Examiner*—Jasmine Clark
(74) *Attorney, Agent, or Firm*—Hamre, Schumann, Mueller & Larson, P.C.

(57) ABSTRACT

A semiconductor device has a semiconductor substrate having first and second surface, a first resin film formed on the first surface of the semiconductor substrate and a second resin film formed on the second surface of the semiconductor substrate. A projection electrode or an interconnection is formed on the first surface of the semiconductor substrate, the second resin film is made of low elastic resin which is capable of absorbing an impact applied to the second surface of the semiconductor substrate and the second resin film is thinner than the semiconductor substrate.

17 Claims, 3 Drawing Sheets

SEMICONDUCTOR DEVICE AND THE MANUFACTURING METHOD FOR THE SAME

The present invention claims foreign priority to Japanese patent application no. 2003-406703, filed on Dec. 5, 2003, the contents of which is incorporated herein by reference.

BACKGROUND OF THE INVENTION

1. Field of the Invention

This invention relates to a small and thin semiconductor device which is useful for use in a portable device, such as a cellular phone or an IC card.

2. Description of the Related Art

Conventionally, along with the reduction in apparatus size and thickness, thinning-at-back process for reducing wafer thickness is carried out to reduce the thickness of a semiconductor chip. The reduction of the semiconductor chip is performed by a grinding process to mechanically grind at the back of a semiconductor substrate having semiconductor elements, interconnects, etc. formed on a surface thereof (hereinafter, merely referred to as "wafer"), by an etching process to chemically dissolve the backside or by both of those processes. Usually, where grinding is made as a thinning-at-back process, a non-rigid protection film is bonded on the wafer surface so that, through the protection film, the wafer can be urged at its back onto a grindstone. In this state, grinding is performed by rotating the grindstone.

However, as for the wafer thinned by back grinding, fracture is ready to occur in the wafer or semiconductor chips upon handling by a transfer robot, etc. in the subsequent process, such as cutting process to cut the wafer into individual semiconductor chips, or mount process to mount the cut semiconductor chips onto the lead frame. Particularly, nowadays, because the wafer has an increasing its diameter, fracture occurs more readily in the wafer thinned by back grinding.

In order to solve such a problem, the Japanese Patent Unexamined Publication no. JP-A-11-150090 proposes that, a resin film i.e., polyamide or epoxy, is formed on the wafer surface after forming a projection electrode group on a wafer surface, then thermo-set and hardened, thereby using the hardened resin film as a protection film. The semiconductor device manufacturing method described in the JP-A-11-150090 shows that, the wafer is ground at its back after forming a resin film, furthermore, the top region of the projection electrode group is exposed by removing and etching the surface of the resin film, after that, cutting the wafer along scribe lines into individual semiconductor chips. Meanwhile, it also shows to form an insulation protection reinforcing film by plasma CVD process The plasma CVD process is performed over the resin film surface in an area excepting the side surface of the semiconductor chip the back surface thereof and projection electrode surface.

The semiconductor chip fabricated by this method is covered with a hardened resin film in a surface excepting the exposed projection electrode top regions. Accordingly, during grinding the back or cutting the wafer into individual chips, handling can be done favorably without causing fracture in the wafer or chips. Meanwhile, because the semiconductor chip can be mounted by merely connecting the exposed projection electrode top region with the electrode pad of a wiring board, the semiconductor device can be made thinner conspicuously as compared with the structure extending the external terminal by use of wire bonding, etc.

However, the semiconductor device in the above-described publication JP-A-11-150090 remains in a state polished or etched in order to reduce the thickness of the semiconductor substrate at its back, in other words, semiconductor device is exposed at its substrate backside. Consequently, despite fracture is reduced in back grinding or during handling, the following problem cannot be lessened. Namely, during cutting into semiconductor chips called dicing process, small breakages and micro-cracks called chipping as shown in FIG. 4 readily occur in the individual piece peripheries (cutting regions) in the backside of the semiconductor device. Such breakages and cracks possibly lead to conspicuous lowering in semiconductor device reliability. Meanwhile, during mounting the cut semiconductor chips onto a wiring board, etc., in case there is a foreign matter on the backside of the semiconductor substrate, after mounted on the wiring board, stress is easily applied through the foreign matter to the substrate backside where the semiconductor chip is exposed thus readily causing cracks and breakages in the semiconductor chip. Meanwhile, an impact is applied by such an impact to the semiconductor device upon sucking by a transport suction collet of the mounter during mounting the semiconductor device onto a wiring board, etc., thus raising a fear to cause cracks and breakages in the semiconductor device. Meanwhile, there is a possibility that the wafer warps resulting from a difference in thermal expansion/contraction coefficient between the semiconductor substrate and the resin.

SUMMARY OF THE INVENTION

Therefore, it is an object of the present invention to solve the above mentioned technical problems and provide a semiconductor device maintained in a reduced thickness of the semiconductor device and reduced in cracks or breakages caused in the semiconductor device.

In order to solve the above problem, according to a first aspect of the present invention, there is provided a semiconductor device, comprising:

a semiconductor substrate having first and second surface;

a first resin film formed on the first surface of the semiconductor substrate; and a second resin film formed on the second surface of the semiconductor substrate;

wherein a projection electrode or an interconnection is formed on the first surface of the semiconductor substrate, the second resin film is made of low elastic resin which is capable of absorbing an impact applied to the second surface of the semiconductor substrate, and the second resin film is thinner than the semiconductor substrate.

According to a second aspect of the present invention, there is provided a semiconductor device, comprising:

a semiconductor substrate having first and second surface;

a first resin film formed on the first surface of the semiconductor substrate; and a second resin film formed on the second surface of the semiconductor substrate;

wherein a projection electrode or an interconnection is formed on the first surface of the semiconductor substrate, and an elastic modulus of the second resin film is 15 GPa or less.

According to a third aspect of the present invention according to the first aspect of the present invention, it is preferable that the second resin film is thinner than the first resin film.

According to a fourth aspect of the present invention according to the second aspect of the present invention, it is preferable that the second resin film is thinner than the first resin film.

According to a fifth aspect of the present invention according to the first aspect of the present invention, it is preferable that a thickness of the second resin film is 30 µm or less.

According to a sixth aspect of the present invention according to the second aspect of the present invention, it is preferable that a thickness of the second resin film is 30 µm or less.

According to a seventh aspect of the present invention according to the first aspect of the present invention, it is preferable that the second resin film is transparent to thereby confirm a mark putted on the second surface of the semiconductor substrate.

According to an eighth aspect of the present invention according to the second aspect of the present invention, it is preferable that the second resin film is transparent to thereby confirm a mark putted on the second surface of the semiconductor substrate.

According to a ninth aspect of the present invention according to the first aspect of the present invention, it is preferable that a thickness of the first resin film is 50 µm or more.

According to a tenth aspect of the present invention according to the second aspect of the present invention, it is preferable that a thickness of the first resin film is 50 µm or more.

According to an eleventh aspect of the present invention according to the first aspect of the present invention, it is preferable that a thickness of the first resin film is 100 µm or less.

According to a twelfth aspect of the present invention according to the second aspect of the present invention, it is preferable that a thickness of the first resin film is 100 µm or less.

According to a thirteenth aspect of the present invention according to the first aspect of the present invention, it is preferable that an elastic modulus of the second resin film is 15 GPa or less.

According to a fourteenth aspect of the present invention according to the first aspect of the present invention, it is preferable that an elastic modulus of the second resin film is 5 GPa.

According to a fifteenth aspect of the present invention according to the second aspect of the present invention, it is preferable that the elastic modulus of the second resin film is 5 GPa.

According to a sixteenth aspect of the present invention according to the first aspect of the present invention, it is preferable that a thickness of the semiconductor substrate is 550 µm or less.

According to a seventeenth aspect of the present invention according to the second aspect of the present invention, it is preferable that a thickness of the semiconductor substrate is 550 µm or less.

According to an eighteenth aspect of the present invention, there is provided a manufacturing method for a semiconductor device, comprising steps of:

forming a projection electrode or an interconnection on a first surface of a semiconductor substrate;

forming a first resin film on the first surface of the semiconductor substrate with low elastic resin which is tolerant against a physical deformation of the semiconductor substrate;

thinning the semiconductor substrate by polishing, grinding or chemically etching on a second surface of the semiconductor substrate;

forming a second resin film on the second surface of the semiconductor substrate; and cutting the semiconductor substrate into individual pieces, wherein the second resin film has an elastic modulus which is equivalent to that of the first resin film, and the second resin film is thinner than the first resin film.

According to a nineteenth aspect of the present invention according to the eighteenth aspect of the present invention, it is preferable that the first resin film covers the projection electrode or the interconnection.

According to a twentieth aspect of the present invention according to the eighteenth aspect of the present invention, it is preferable that the manufacturing method for the semiconductor device further comprising a step of:

putting a mark on the second surface of the semiconductor surface after thinning the semiconductor substrate.

According to a twenty-first aspect of the present invention according to the eighteenth aspect of the present invention, it is preferable that the manufacturing method for the semiconductor device further comprising a step of:

thinning the first resin film so as to expose a top portion of the projection electrode or the interconnection after forming the second resin film.

According to the present invention, because the resin film formed on the other surface is low in elasticity, it is prevented from occurring cracks and breakages in the semiconductor device. Meanwhile, even where the semiconductor chip is mounted in a state foreign matter is put on the backside of the semiconductor chip, the concave-convex caused by the foreign matter can be somewhat relaxed, to prevent against cracks and breakage in the semiconductor chips or substrate. Incidentally, because the resin film formed on the other surface is smaller than the film thickness of the resin film formed on the one surface, the semiconductor surface can be suppressed from increasing the thickness to a required extent or more. Meanwhile, because the resin layer is provided not only on the one surface but also on the other surface, force acts to warp the wafer in opposite directions. Thus, there is less occurrence of warping than the case of in the resin film is formed on one side of the wafer, which is caused by a difference in thermal expansion/contraction between the semiconductor substrate and the resin film. Meanwhile, due to less wafer warp, semiconductor chips are to be cut out of a wafer in a flat state of the wafer. Thus, semiconductor chips can be cut out of the wafer evenly at both the center and the peripheral regions thereof.

DETAILED DESCRIPTION OF THE PREFERRED EMBODIMENTS

Figure 1A:
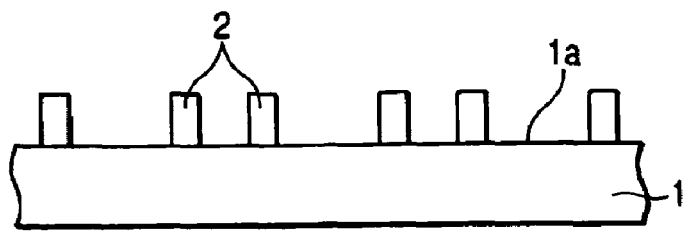
FIG. 1A through 1F are showing wafer sectional views illustratively showing in process order of a method for manufacturing a semiconductor device of the present invention.
Figure 1B:
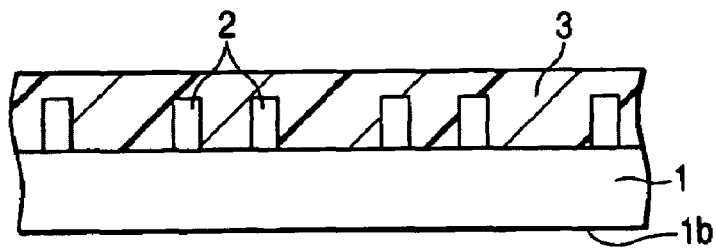
Figure 1C:
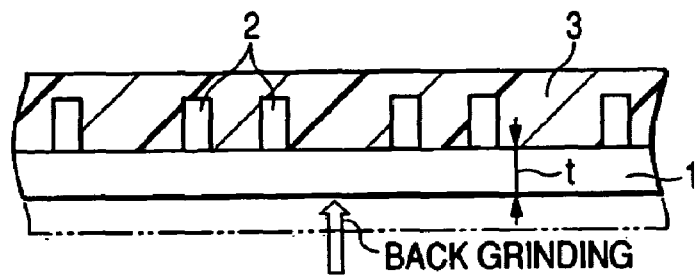
Figure 1D:
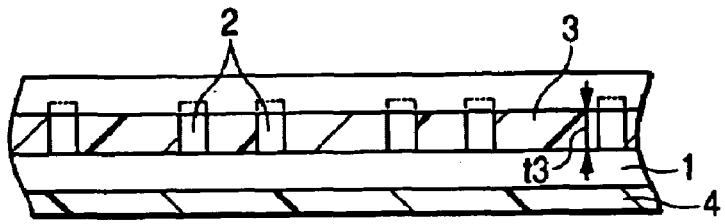
Figure 1E:
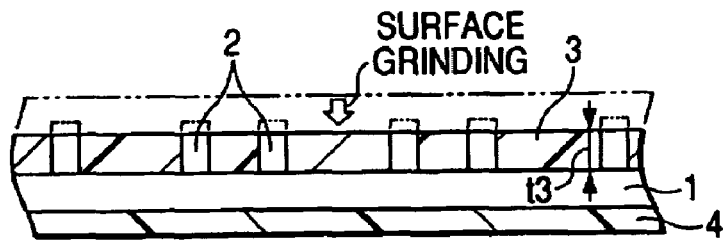
Figure 1F:
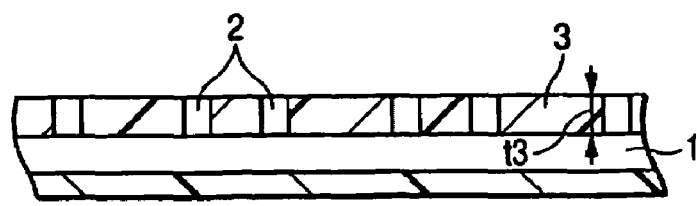
Figure 2:
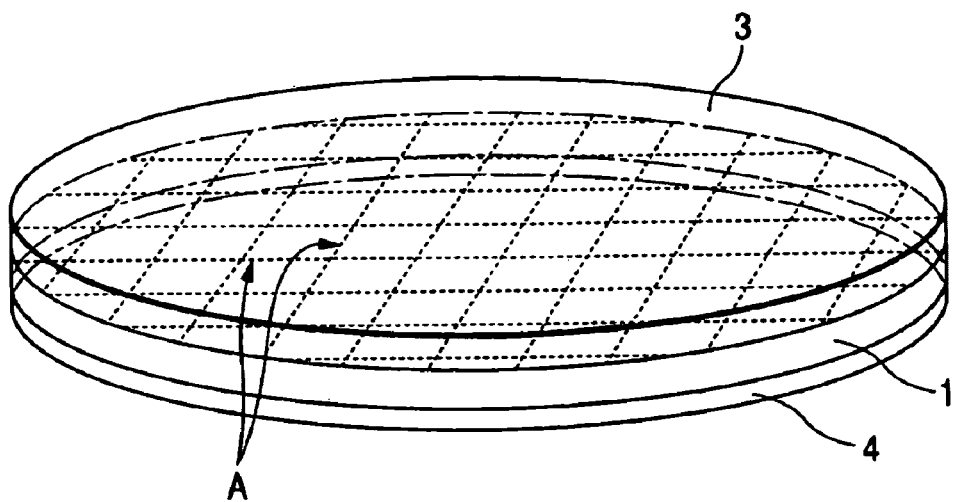
FIG. 2 is a perspective view illustratively showing the semiconductor substrate in a wafer state.
Figure 3:
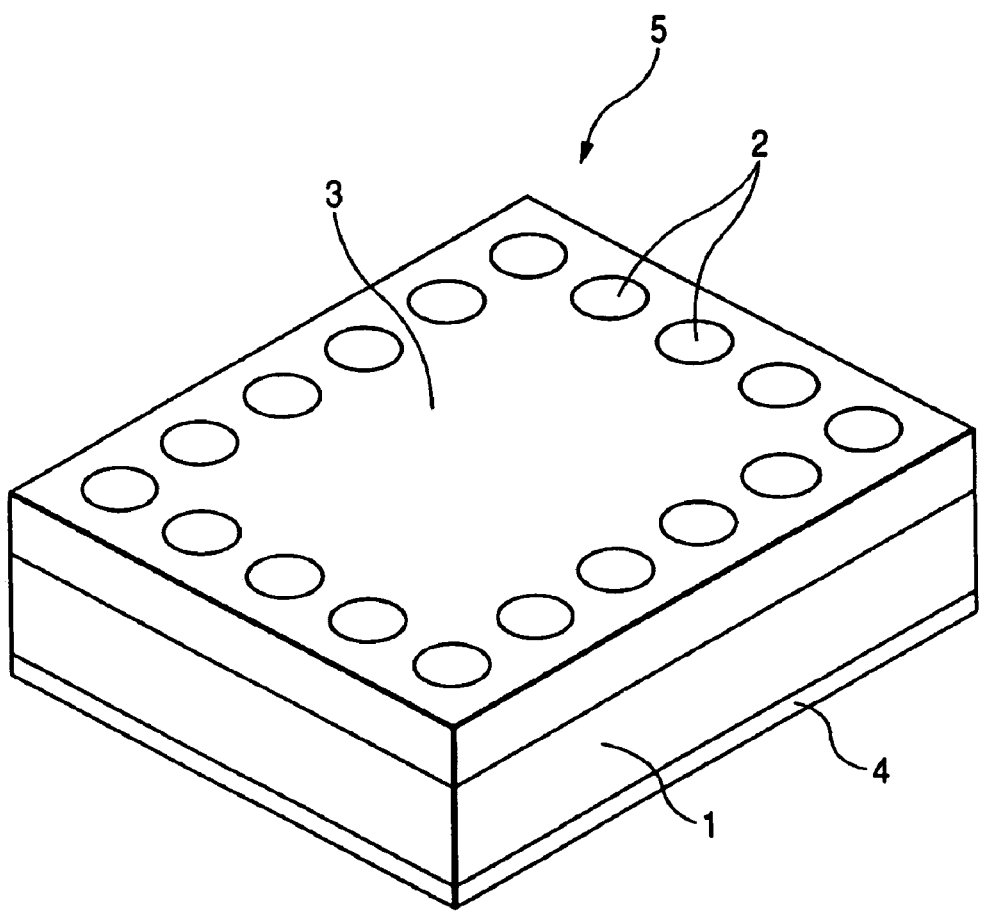
FIG. 3 is an illustrative perspective view of a semiconductor chip of the present invention.
Figure 4:
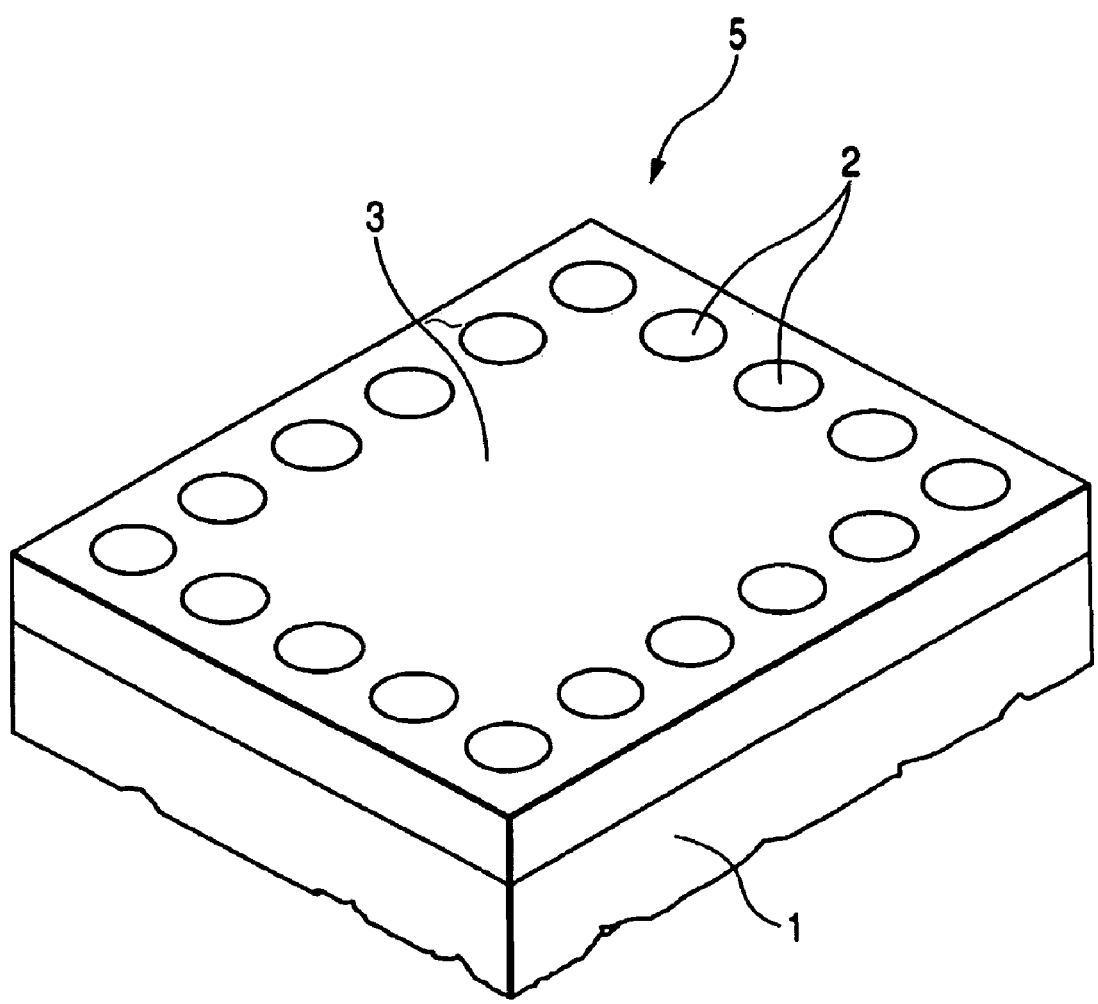
FIG. 4 is a perspective view for explaining the problem in a semiconductor chip of a related art.

Referring to FIGS. 1 to 3, explanation is made in detail on an embodiment for carrying out the present invention.

Embodiment 1

FIG. 1 is an illustrative wafer sectional view showing, in process order, a method for manufacturing a semiconductor device according to an embodiment of the invention. In the figure, a semiconductor substrate 1 (also referred to as "wafer 1"), processed by various device-forming and wiring processes and so on, is covered with a protection film (passivation film) (not shown) formed by a nitride film or the like in the area except for terminal regions (not shown) on a surface 1a as a surface on an active surface layer side. In the terminal regions, there are formed pads for electric connections of the circuits formed on the wafer to the external.

On the pads, projection electrodes 2 (posts) are formed in plurality, for example, of copper (Cu), gold (Au), solder, etc. by electroplating, for example, as shown in FIG. 1A. The projection electrode 2 has a height of approximately 50 μm with respect to the protection film surface, assuming a columnar form such as a circular cylinder or a square cylinder. In case a gold layer is previously formed on a surface of the pad, junction can be favorably kept with the projection electrode 2 and further protection can be preferably provided for the pad. Meanwhile, scribe lines (not shown) are formed in the surface 1a of the wafer 1 at boundaries between individual semiconductor devices (in positions shown by the arrow A in FIG. 2).

Then, a first resin film 3 is formed on the surface 1a of the wafer 1, which is to protect the surface of the wafer 1 (FIG. 1B). The first resin film 3 can be obtained by applying a liquid resin onto the surface 1a by screen printing method, spin coat method, bar coating method or the like, and thereafter hardening it. The resin in its kind can be polyamide or epoxy resin. The first resin film 3 is formed in a thickness that, after hardening, the projection electrodes 2 can be buried, i.e. approximately 50-100 μm. This can make a surface of the first resin film 3 planar regardless of the presence or absence of projection electrodes 2. Note that the first resin film is desirably given with a post-hardened elastic modulus of 15 GPa or less, preferably approximately 5 GPa.

Subsequently, the wafer 1 thus formed with the first resin film 3 is ground at its back surface 1b by use, for example, of a grinder down to a wafer 1 thickness of 550 μm or smaller (FIG. 1C). At this time, the first resin film 3 is formed in a manner completely covering the top regions of the projection electrodes 2, wherein the first resin film 3 is made planar at its surface. Thus, the wafer 1 can be ground at the side forming the first resin film 3 by uniformly applying pressure. Thereafter, data marking is made on the backside of the ground wafer by means of laser, ink or the like, followed by forming a second resin film 4 in a thickness of approximately 30 μm on the backside of the semiconductor substrate (FIG. 1D). The second resin layer 4 is formed thinner than the first resin film 3 because it is preferably made as thin as possible within the scope that the effect against impact force is to be obtained. The second resin film 4 is formed by applying a liquid resin, such as of polyimide or epoxy, by screen print method, spin coat method, bar coating method or the like similarly to the first resin film 3 and thereafter hardening it into a thickness of approximately 30 μm. The second resin film 4 is desirably low in elasticity having an elastic modulus of 15 GPa or lower that is higher in elastic force than the insulation protection reinforcing film, similarly to the first resin film. Meanwhile, the second resin film 4 desirably has a light-translucent property so that the above-mentioned marking can be confirmed.

Subsequently, the resin layer, which the first resin film 3 formed on the surface of the wafer on which the projection electrodes 2 or interconnections are provided, is ground by using a grinder or the like down to a thickness of approximately 50 μm or smaller, to thereby expose the top regions of the projection electrodes 2. In this case, chemical etching with a chemical agent may be conducted in place of mechanical grinding, or the both may be carried out.

Subsequently, the wafer 1 formed with the first resin film 3 and second resin film 4 is bonded onto a tape, called a dicing tape. In the cutting process called dicing, the wafer 1 is cut at the scribe lines to thereby form semiconductor chips 5 as shown in FIG. 3. Accordingly, the first resin film 3 desirably has a light-translucent property in order to easily confirm scribe-line positions. Tape bonding for scribing may be on the first resin film 3 on the surface having electrodes or on the opposite second resin film 4. However, it is better to bond the tape on the second resin layer 4, because the damage to the surface 1a can be suppressed during stripping. Incidentally, due to adhesion force (bonding force) of the dicing tape, there is less possibility for semiconductor chip particles to fly about.

As described above, according to the embodiment, a resin protection layer is formed by the first resin film 3 formed on the surface 1a of the wafer 1 and the second resin film 4 formed on the backside. During handling the wafer 1 in the cutting process and cutting the wafer 1 by means of a dicing blade, the first resin film 3 and the second resin film 4 reinforce the wafer 1. Thus, breakage hardly occurs in the wafer 1 or semiconductor chips 5. Accordingly, the wafer 1 can be thinned down to a desired thickness, thus contributing to thickness reduction of semiconductor chips 5.

In the semiconductor chip 5 which is individually apart shown in FIG. 3, surface damages can be suppressed by the first resin film 3 formed on the surface 1a. Furthermore, the second resin film 4 formed on the backside can suppress the damages suffered by an impact to the backside. This effect has been confirmed to tolerant about 4 times impact as compared to that is not formed with a second resin layer 4. Meanwhile, the reason the second resin film 4 is formed smaller in thickness than the first resin film 3 is because the resin on the surface 21a requires a somewhat extent of thickness in order to prevent against a concavo-convex made in the surface of the first resin film under the influence of the projection electrodes 2. Namely, the effect of absorbing an impact to the backside saturates at a resin thickness of approximately 30 μm. No further effect is to be expected with the greater resin thickness. In other words, in stead of making the second resin 4 layer thin, by making the wafer 1 thick, the bending strength of the semiconductor wafer becomes high, thus, a reliable semiconductor device can be obtained without increasing the thickness of the individual semiconductor devices.

In this manner, the wafer 1 of the present invention is protected and reinforced at the both surfaces respectively by two kinds of resins. Namely, the surface 1a of the wafer 1 is reinforced and protected by the resin layer comprising the first resin film 3 while the backside is also reinforced and protected by the resin layer comprising the second resin film 4. Particularly, by using a low elastic resin having lower elasticity than that of the insulation protection reinforcing film as each resin film, impact tolerance can be increased higher even with a small resin thickness than the case with a high elastic modulus. Meanwhile, because the first resin film 3 and the second resin film 4 have a light-translucent property, it is possible to confirm scribe line positions and marked data of characters, etc. on the wafer 1 backside. Incidentally, because the surface 1a of the wafer 1 is sealed by the first resin film 3 and the projection electrodes 2 are exposed, further packaging is not required for the semiconductor chip 5. Accordingly, it is possible to obtain a semiconductor device extremely reduced in size and thickness while maintaining quality. Meanwhile, because resin thickness is satisfactorily small, the semiconductor substrate can be increased in thickness correspondingly thus increasing bending strength of the semiconductor device. Therefore, it can improve the reliability as a discrete semiconductor device as well as the reliability that is after mounted on a wiring board. The semiconductor device (semiconductor chip 5) thus formed can be mounted so as to oppose (face down) the exposed projection electrodes 2 to the electrode pads formed on the wiring board.

The above embodiment showed the case the projection electrodes 2 were formed on the terminal regions formed in one surface of the wafer 1. However, In case projecting external interconnections are formed connected to the terminal regions, part of the external interconnections can be exposed out of the first resin film 3 and connected to the electrode pads of the wiring board even where no projection electrodes 2 are formed.

Incidentally, the surface of the resin film is desirably formed planar by forming a first resin film in a manner covering the top regions of the projection electrodes or external interconnections. Then, during back grinding of the wafer 1, the wafer 1 can be evenly pressurized at the side the first resin film 3 is formed. Meanwhile, because the wafer 1 or chips 5, after grinding, is covered at the surface with the first and second resin films thus being protected and reinforced, breakage less occurs in the wafer 5 or chips 5 during handling thereof. The projection electrodes and interconnections are exposed at top regions by carrying out a process to remove the surface of the first resin film. This process may be by chemical processing such as etching or by physical processing such as polish.

In the case of exposing the top regions of the projection electrodes or external interconnections by physical processing such as grinding, the top regions of the projection electrodes or external interconnections are made flush with the surface of the resin layer. Due to this, after carrying out a process to expose the top regions of the projection electrodes or external interconnections, polish or chemical processing such as etching is made by uniformly applying pressure to the one surface of the semiconductor substrate, thereby making it possible to increase the freedom in the order of the processes to be performed during manufacture. However, it is preferred to carry out the process of exposing the top regions of the projection electrodes or interconnections in the active surface after performing marking such as of product number, etc. on a ground surface after back grinding and a low elastic resin is formed thereon, because of reduced fear of damaging the exposed areas or chemical change in the exposed areas.

Because the semiconductor chip cut as an individual chip from a wafer can be mounted by connecting its exposed area of the projection electrode or external interconnection directly to an electrode pad or lead frame of a wiring board, mounting is possible at chip size. Further, a projecting electrode (bump) of solder or the like on the exposed projection electrode or external interconnection can be mounted. Meanwhile, after attaching the semiconductor substrate at its backside to a board or a lead frame, seal resin may be applied by potting after performing a wire-bonding connection between the exposed projection electrode 2 or external interconnection and a lead frame or external electrode. In this manner, various modifications are possible within the scope within the matter set forth in the claims, thus providing a technology useful in reducing the size and improving the yield for personal digital assistants, such as cellular phones.

While there has been described in connection with the preferred embodiments of the present invention, it will be obvious to those skilled in the art that various changes and modification may be made therein without departing from the present invention, and it is aimed, therefore, to cover in the appended claim all such changes and modifications as fall within the true spirit and scope of the present invention.

What is claimed is:

1. A semiconductor device, comprising:
    a semiconductor substrate having first and second surface;
    a first resin film formed on the first surface of the semiconductor substrate; and
    a second resin film formed on the second surface of the semiconductor substrate;
    wherein a projection electrode or an interconnection is formed on the first surface of the semiconductor substrate,
    the second resin film is made of low elastic resin which is capable of absorbing an impact applied to the second surface of the semiconductor substrate, and
    the second resin film is thinner than the semiconductor substrate.

2. A semiconductor device as set forth in claim 1, wherein the second resin film is thinner than the first resin film.

3. A semiconductor device as set forth in claim 1, wherein a thickness of the second resin film is 30 µm or less.

4. A semiconductor device as set forth in claim 1, wherein the second resin film is transparent to thereby confirm a mark putted on the second surface of the semiconductor substrate.

5. A semiconductor device as set forth in claim 1, wherein a thickness of the first resin film is 50 µm or more.

6. A semiconductor device as set forth in claim 1, wherein a thickness of the first resin film is 100 µm or less.

7. A semiconductor device as set forth in claim 1, wherein an elastic modulus of the second resin film is 15 GPa or less.

8. A semiconductor device as set forth in claim 1, wherein an elastic modulus of the second resin film is 5 GPa.

9. A semiconductor device as set forth in claim 1, wherein a thickness of the semiconductor substrate is 550 µm or less.

10. A semiconductor device, comprising:
    a semiconductor substrate having first and second surface;
    a first resin film formed on the first surface of the semiconductor substrate; and
    a second resin film formed on the second surface of the semiconductor substrate;
    wherein a projection electrode or an interconnection is formed on the first surface of the semiconductor substrate, and
    an elastic modulus of the second resin film is 15 GPa or less.

11. A semiconductor device as set forth in claim 10, wherein the second resin film is thinner than the first resin film.

12. A semiconductor device as set forth in claim 10, wherein a thickness of the second resin film is 30 µm or less.

13. A semiconductor device as set forth in claim 10, wherein the second resin film is transparent to thereby confirm a mark putted on the second surface of the semiconductor substrate.

14. A semiconductor device as set forth in claim 10, wherein a thickness of the first resin film is 50 μm or more.

15. A semiconductor device as set forth in claim 10, wherein a thickness of the first resin film is 100 μm or less.

16. A semiconductor device as set forth in claim 10, wherein the elastic modulus of the second resin film is 5 GPa.

17. A semiconductor device as set forth in claim 10, wherein a thickness of the semiconductor substrate is 550 μm or less.

* * * * *